(12) United States Patent
Li et al.

(10) Patent No.: US 9,791,132 B2
(45) Date of Patent: Oct. 17, 2017

(54) LIGHT SOURCE AND ILLUMINATING DEVICE

(75) Inventors: Yi Li, Pleasanton, IN (US); Quan Zhang, Shenzhen (CN); Yi Yang, Shenzhen (CN)

(73) Assignee: APPOTRONICS CORPORATION LIMITED, Shenzhen (CN)

( * ) Notice: Subject to any disclaimer, the term of this patent is extended or adjusted under 35 U.S.C. 154(b) by 39 days.

(21) Appl. No.: 14/364,387

(22) PCT Filed: Aug. 29, 2012

(86) PCT No.: PCT/CN2012/080735
§ 371 (c)(1),
(2), (4) Date: Oct. 1, 2014

(87) PCT Pub. No.: WO2013/086872
PCT Pub. Date: Jun. 20, 2013

(65) Prior Publication Data
US 2015/0109773 A1    Apr. 23, 2015

(30) Foreign Application Priority Data
Dec. 11, 2011 (CN) .......................... 2011 1 0409899

(51) Int. Cl.
*F21K 9/60* (2016.01)
*F21V 13/12* (2006.01)
(Continued)

(52) U.S. Cl.
CPC ................ *F21V 13/12* (2013.01); *F21K 9/60* (2016.08); *F21V 5/007* (2013.01); *F21V 5/008* (2013.01);
(Continued)

(58) Field of Classification Search
CPC ........ F21V 5/007; F21V 13/12; F21V 5/0008; F21Y 2101/02; F21Y 2105/0001;
(Continued)

(56) References Cited

U.S. PATENT DOCUMENTS 5,813,753 A * 9/1998 Vriens .................... H01L 33/502
257/13
5,906,429 A * 5/1999 Mori .................... G03F 7/70058
250/492.2

(Continued)

FOREIGN PATENT DOCUMENTS

| CN | 101027579 | 8/2007 |
|---|---|---|
| CN | 101067663 | 11/2007 |

(Continued)

OTHER PUBLICATIONS

International Search Report in the parent PCT application No. PCT/CN2012/080735, dated Nov. 29, 2012.

(Continued)

*Primary Examiner* — Bao Q Truong
(74) *Attorney, Agent, or Firm* — Chen Yoshimura LLP

(57) ABSTRACT

A light source comprises a light emitting diode array (101) and a collimator array (102). The light emitting diode array (101) comprises at least two light emitting diode units (101a, 101b) that emit light of different colors; the collimator array (102) is used for collimating light emitted by the light emitting diode units (101a, 101b) and keep the optical extension of the light emitted by the light emitting diode units (101a, 101b) substantially unchanged. The light source further comprises a dodging device (103) used for dodging light emerging from the collimator array (102). An illuminating device comprises the light source. The light emitting diode units (101a, 101b) and the collimator unit (102a) in the light source and the illuminating device minimize the (Continued)

optical extension of the emergent light, thereby maximizing the luminance.

20 Claims, 6 Drawing Sheets

(51) Int. Cl.
| | | |
|---|---|---|
| *F21V 5/00* | (2015.01) | |
| *H01L 33/58* | (2010.01) | |
| *F21Y 101/00* | (2016.01) | |
| *F21Y 105/10* | (2016.01) | |
| *F21Y 113/10* | (2016.01) | |
| *F21Y 115/10* | (2016.01) | |
| *H01L 25/075* | (2006.01) | |
| *H01L 33/54* | (2010.01) | |

(52) U.S. Cl.
CPC .......... *H01L 33/58* (2013.01); *F21Y 2101/00* (2013.01); *F21Y 2105/10* (2016.08); *F21Y 2113/10* (2016.08); *F21Y 2115/10* (2016.08); *H01L 25/0753* (2013.01); *H01L 33/54* (2013.01); *H01L 2924/0002* (2013.01)

(58) Field of Classification Search
CPC .............. F21Y 2105/10; F21Y 2115/10; F21Y 2113/10; F21Y 2101/00; F21K 9/50; F21K 9/60; H01L 33/58; H01L 25/0753; H01L 33/54; H01L 2924/0002
See application file for complete search history.

(56) References Cited

U.S. PATENT DOCUMENTS

| | | | |
|---|---|---|---|
| 7,506,998 B2 | 3/2009 | Ansems et al. | |
| 8,770,761 B2 * | 7/2014 | Miura | H04N 9/315 |
| | | | 257/72 |
| 8,974,083 B2 * | 3/2015 | Weekamp | F21V 29/22 |
| | | | 362/249.01 |
| 9,124,816 B2 * | 9/2015 | Miura | G03B 21/14 |
| 9,222,643 B2 * | 12/2015 | Zhang | F21V 5/008 |
| 2007/0263383 A1 | 11/2007 | Ansems et al. | |
| 2012/0147333 A1 | 6/2012 | Joergensen | |
| 2012/0153852 A1 | 6/2012 | Zhang et al. | |
| 2012/0154759 A1 | 6/2012 | Jorgensen | |
| 2012/0217519 A1 | 8/2012 | Xu et al. | |
| 2013/0194798 A1 * | 8/2013 | Yang | F21V 5/007 |
| | | | 362/237 |

FOREIGN PATENT DOCUMENTS

| | | |
|---|---|---|
| CN | 101373046 | 2/2009 |
| CN | 101634754 | 1/2010 |
| CN | 201487708 U | 5/2010 |
| CN | 101770150 | 7/2010 |
| CN | 101988631 | 3/2011 |
| CN | 102074637 | 5/2011 |
| CN | 102142511 | 8/2011 |
| CN | 102155713 | 8/2011 |
| CN | 102518964 | 6/2012 |
| JP | 2006155956 | 6/2006 |
| WO | 2011006501 A1 | 1/2011 |
| WO | 2011060618 A1 | 5/2011 |
| WO | 2011/124140 A1 | 10/2011 |

OTHER PUBLICATIONS

IPRP in the parent PCT application No. PCT/CN2012/080735, dated Jun. 17, 2014.
Supplementary European Search Report in counterpart application EP 12 857 395.3, dated Jul. 17, 2015.
EP Office Action in counterpart application EP 12 857 395.3, date Oct. 27, 2016.

\* cited by examiner

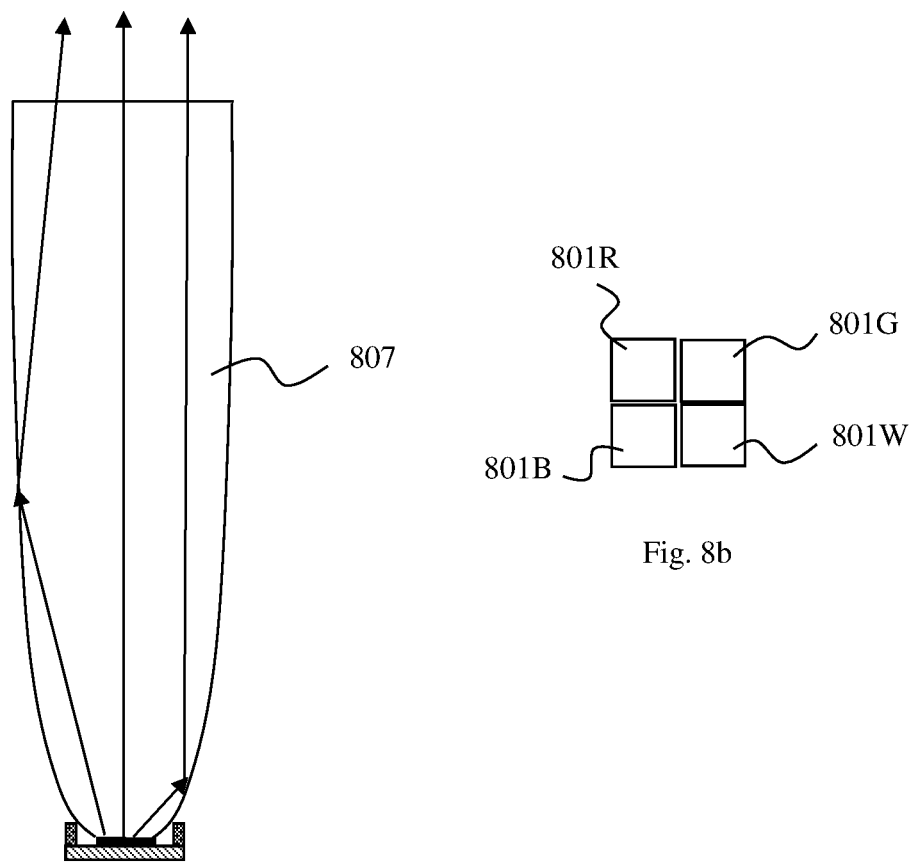
Fig. 8a
Fig. 8b
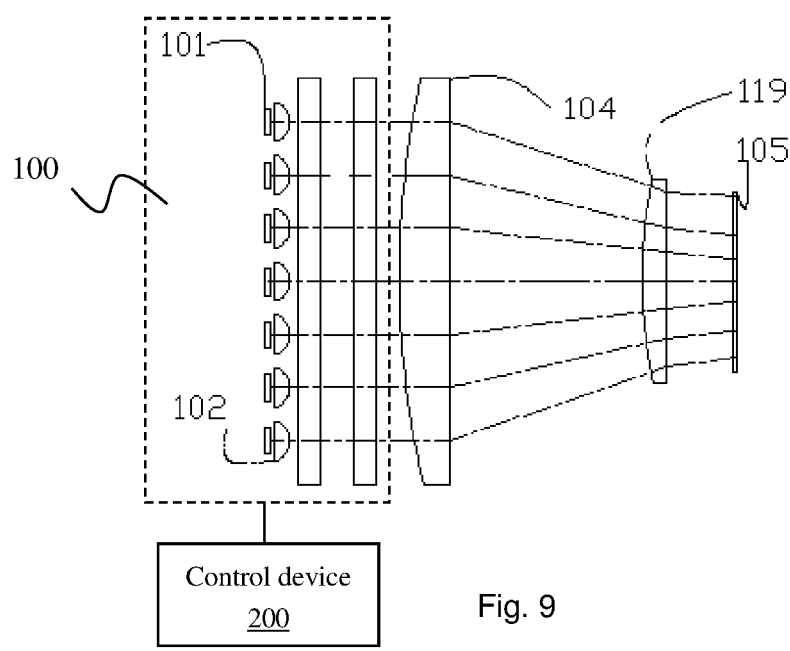
Fig. 9

LIGHT SOURCE AND ILLUMINATING DEVICE

BACKGROUND OF THE INVENTION

Field of the Invention

This invention relates to the technical field of optics, and in particular, it relates to a light source and illumination device.

Description of the Related Art

Currently, multi-color semiconductor light sources are used more and more widely in stage lighting, decorative lighting and other fields. However, in actual products, because each color of the multi-color semiconductor light sources is generated separately by individual semiconductor chips, there is often a problem of non-uniform color mixing.

Japanese patent JP2006155956, Chinese patent 200810045644 and CN 102155713 respectively disclose the optical structures of multi-color semiconductor light sources. In such optical structures, light emitting diode (LED) chips of different colors together form a planar array, and above each LED is a corresponding collimator for collimating the light from the LED. The light from the LED, after collimation by the collimators, are incident on a fly-eye lens to make the light from different color LEDs uniform.

In another approach disclosed in Chinese patent CN101988631, a set of dichroic filters combine lights from different color LED arrays using wavelength-based combination, where the light from each LED array is the same color. Compared to the earlier mentioned approach, this approach has the advantage of small etendue, but a shortcoming is that it can only combine monochromatic lights with no wavelength overlap, and cannot combined wideband light such as white light. Also, this approach is relatively costly due to the use of dichroic filters.

In the approach where LEDs of different colors together form a planar array, how to minimize the etendue of the light source is a key factor in controlling the brightness of the light source. However, in conventional technologies, the etendue of light sources is not optimized.

The packaging structure of a conventional LED chip is shown in FIG. 11. The LED chip 1101 is mounted on a heat conducting substrate 1102, and a silicone lens 1103 having an arc shaped exterior is used to seal the LED chip 1101 and to further enhance the light extraction efficiency of the LED chip. The silicone lens 1103 can increase the total luminous flux emitted by the LED by 20-30%, but at the same time also increases its etendue by 2-2.5 times (refer to equation (2) in the descriptions later). Therefore, the emission brightness, i.e. the ratio of the total luminous flux and the etendue, is significantly reduced by the use of the silicone lens 1103. In applications that do not have a requirement on the etendue, such as general illumination, the packaging structure shown in FIG. 11 is adequate, because it can obtain higher output luminous flux; however, for applications that require limited etendue such as projection light and stage light that requires specific light spot sizes, this type of packaging structure will significantly reduce the ultimate emission brightness.

On the other hand, a commonly used collimating device is shown in FIG. 12 as item 1201. This collimating device is typically referred to as a total internal reflection (TIR) lens, and its principle is to use refraction by the center curved surface 1201a and total reflection by the surrounding side call 1201b to collimate the light of the LED. An advantage of this type of collimating device is that it can collect light emitted at all angles, but its shortcoming is that it can cause the etendue of the output light to be far greater than the etendue of the light source, which significantly reduces the light emission brightness.

SUMMARY OF THE INVENTION

A main technical problem to be solved by this invention is the large etendue and low brightness of multi-color uniform light sources.

The present invention provides a light source, including an LED array, the LED array including at least two types of LED units emitting two different color lights, each LED unit including one LED chip. The surface of the LED chip is covered by either a low-refractive index transparent medium having a refractive index lower than 1.1, or a high-refractive index transparent medium having a refractive index greater than 1.3, wherein the high-refractive index medium has a thickness less than 50% of the diameter of the bounding circle of the light emitting surface of the LED chip.

The light source of the present invention further includes a collimator array, which includes at least one collimator unit; the collimator unit corresponding to at least one LED unit, for collimating the light from the at least one LED unit while maintaining the etendue of the light of the at least one LED unit substantially unchanged.

The light source of the present invention further includes a light homogenizing device for smoothing the light from the collimator array.

The present invention also provides an illumination device which includes the above light source.

Compared to conventional technology, the present invention has the following advantages:

In the light source and illumination device of the invention, the LED unit and the collimator unit minimize the etendue of the output light, thereby maximizing the emission brightness.

BRIEF DESCRIPTION OF THE DRAWINGS

FIGS. 1b and 1c are respectively two implementations of the light homogenizing device of the embodiment of FIG. 1a.

FIGS. 8a and 8b illustrates the second type of collimator unit corresponding to four LED units in this invention.

FIG. 9 illustrates the structure of a light emitting device utilizing the first embodiment of the present invention.

DETAILED DESCRIPTION OF THE PREFERRED EMBODIMENTS

Figure 1A:
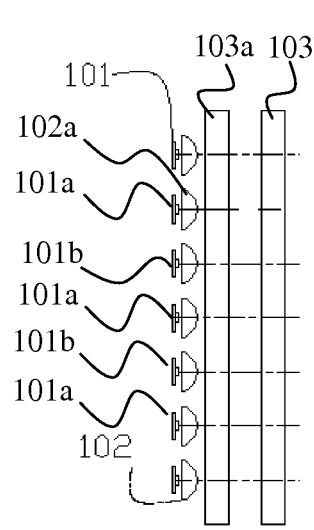
FIG. 1a illustrates the optical structure of a first embodiment of this invention.

FIG. 1a illustrates the optical structure of a first embodiment of this invention. The light source 100 of this embodiment includes an LED array 101, which includes at least two types of LED units 101a and 101b emitting lights of different colors.

The light source 100 further includes a collimator array 102, which includes at least one collimator unit 102a; the collimator units 102a correspond to the LED units 101a, for collimating the light emitted from the LED units 101a and maintaining the etendue of the light from the LED units 101a substantially unchanged.

The etendue E of a light source or light beam is defined as:

$$E = n^2 \iint \cos\theta \cdot dS \cdot d\Omega \quad (1)$$

where n is the refractive index of the medium of the light source or light beam, $\theta$ is the angle between the light ray emitted by an infinitesimal unit of the light source surface and the light emitting axis of the light source, dS is the area of the infinitesimal unit, and $d\Omega$ is the solid angle of the light emitted by the infinitesimal unit. For a light source with a uniform emitting surface, when the light emitting intensity is isotropic within an angular range, its etendue E can be simplified as:

$$E = \pi n^2 \cdot S \cdot \sin^2\phi \quad (2)$$

where S is the area of the light source or the cross section of the waist of the light beam, and $\phi$ is the half angle of light emission of the light source or the light beam.

The brightness of a light source can be defined as the ratio of its total luminous flux and its etendue. The law of etendue conservation states that a geometric optical system cannot reduce the etendue of a light source or light beam, and therefore a geometric optical system cannot increase the brightness of the light source or light beam; at the best, the geometric optical system can maintain the brightness of the light source or light beam unchanged, i.e., corresponding to a constant etendue.

Using the above equation (2), in this invention, to maintain the etendue of the light emitted by the LED unit 101a substantially unchanged by the collimator unit 102a means:

$$S_1 \sin^2\phi_1 = S_2 \sin^2\phi_2 \quad (3)$$

where $S_1$ is the area of the light emitting surface of the LED unit, $\phi_1$ is the maximum half angle of the of light emitted by the LED that is collected, $S_2$ is the area of the output surface of the light after being collimated by the collimator unit 102a, and $\phi_2$ is the half angle of the light outputted by the collimator unit 102a. In practice, $S_2$ is less than or equal to the cross-sectional area of the collimator unit 102a in the direction perpendicular to its light axis. The optimum situation is that $S_2$ is equal to the cross-sectional area of the collimator unit 102a in the direction perpendicular to its light axis, where the output light beam fully fills the output surface of the collimator unit 102a. In this case if the adjacent collimator units are in tight contact with each other, a most compact collimator array can be obtained.

In summary, using the collimator array 102 of this invention, it can be ensured that the etendue of the LED array is not enlarged, so that the brightness of the LED array is not reduced in the collimating process.

Figure 1B:
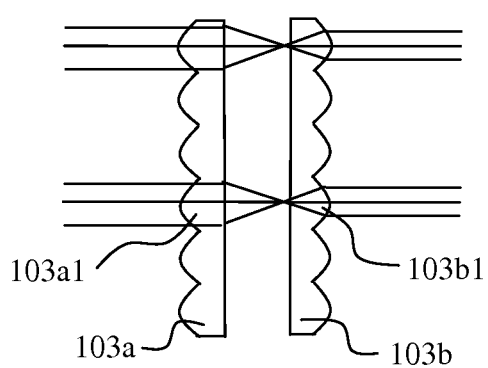

In this embodiment, the light source 100 further includes a light homogenizing device 103, for smoothing the output light from the collimator array 102. Specifically, in this embodiment, the light homogenizing device 103 is a fly-eye lens pair, which includes a first fly-eye lens 103a and a second fly-eye lens 103b, as shown in FIG. 1b. The first fly-eye lens 103a includes periodically arranged first fly-eye lens units 103a1, and the second fly-eye lens 103b includes periodically arranged second fly-eye lens units 103b1, where the first fly-eye lens units 103a1 and the second fly-eye lens units 103b1 have a one-to-one correspondence with each other.

In this embodiment, the collimated light beam from the collimator array 102 is incident on the surface of the first fly-eye lens 103a, and is spatially divided into multiple sub-beams by the periodically arranged first fly-eye lens units of the first fly-eye lens 103a, each first fly-eye lens unit corresponding to a sub-beam. The sub-beam is focused by the corresponding first fly-eye lens unit onto the surface of the corresponding second fly-eye lens unit. In conjunction with the downstream optical design, the shape of each sub-beam on the first fly-eye lens unit can be imaged onto a given position on the projection screen, so that the image ultimately formed on the screen is the superposition of all sub-beams. This achieves a uniform output of the light source. The working principle of fly-eye lenses is well known and will not be described in more detail here.

The first fly-eye lens units 103a1 and the second fly-eye lens units 103b1 are convex lens of the same shape. However, the shape and curvature of the second fly-eye lens units 103b1 do not have to be the same as those of the first fly-eye lens units 103a1; it is even possible for one of the second fly-eye lens units 103b1 and first fly-eye lens units 103a1 to be convex lenses and the other to be concave lenses. The shape of the first and second fly-eye lens units can have various designs based on different applications; as long as the two can have a one-to-one correspondence, they can accomplish the function of smoothing the incident light.

Because the shape of the first fly-eye lens units ultimately determines the shape of the light spots on the screen, based on practical needs, the first fly-eye lens units often have a polygon shape, such as square or rectangles. In illumination applications, to match a round shape of the light spot, in a preferred embodiment, the first fly-eye lens units have the shape of an equal sided hexagon. In this situation, the first fly-eye lens units 103a1 of the first fly-eye lens 103a are arranged in a honeycomb shape. Correspondingly, the second fly-eye lens units 103b1 of the second fly-eye lens 103b are also arranged in a honeycomb shape.

Figure 1C:
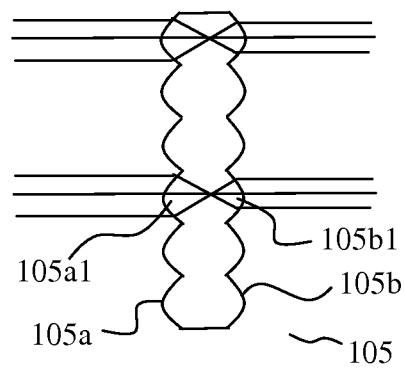

The light homogenizing device shown in FIG. 1b is a fly-eye lens pair 103a and 103b; in practical applications, to simplify design and reduce cost, the two fly-eye lenses can be formed integrally into an integral fly-eye lens, as shown in FIG. 1c. The integral fly-eye lens 105 includes a first surface 105a and a second surface 105b; the first surface 105a includes periodically arranged third fly-eye lens units 105a1, and the second surface 105b includes periodically arranged fourth fly-eye lens units 105b1, where the third fly-eye lens units 105a1 and the fourth fly-eye lens units 105b1 have a one-to-one correspondence with each other. It can be understood that the first surface 105a and the second surface 105b respectively correspond to the first fly-eye lens 103a and second fly-eye lens 103b of the fly-eye lens pair and perform the same light smoothing function.

Similar to the above described fly-eye lens pair, in illumination applications, to match a round shape of the light spot, in a preferred embodiment, the third fly-eye lens units have the shape of an equal sided hexagon. In this situation, the third fly-eye lens units 105a1 of the third fly-eye lens 105a are arranged in a honeycomb shape. Correspondingly, the fourth fly-eye lens units 105b1 of the fourth fly-eye lens 105b are also arranged in a honeycomb shape.

In the light source of this embodiment, the light homogenizing device can also be a diffractive optical element (DOE). Specifically, a DOE is a device having microscopic undulating shapes formed on the surface of a transparent substrate, which can change the light field distribution utilizing interference of the light incident on the surface. Through calculation and design, various shaped uniform light spots can be achieved from the collimated light emitted from the collimator array. This is known in the art and will not be described in detail here.

In this embodiment, the surfaces of the LED units are covered with a low-refractive index transparent medium having a refractive index below 1.1. It can be seen from equation (2) above that, the lower the refractive index of the medium of the light source, the smaller the etendue of the light source. Therefore, in a preferred embodiment, the low-refractive index medium is air. Of course, the low-refractive index medium can also be nitrogen, argon and other chemically inactive gases, which can extend the life of the LED units.

Figure 4A:
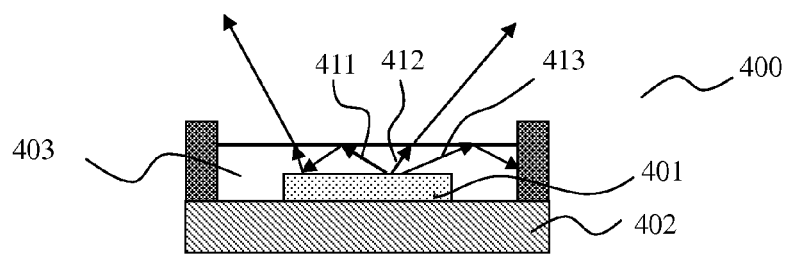
FIG. 4a illustrates an LED of this invention with its surface covered by a high refractive index media.

In practical applications, in particular under extreme working conditions, such as in high temperature, high humidity environment, LED units exposed in air lacks protection, which may shorten their lives. However, protecting them using inert gases has a relatively high cost. Therefore, it is a commonly used technique to cover the surface of the LED chip of the LED unit with a transparent protective layer, as shown in FIG. 4a. Commonly used materials for the transparent protective layer have refractive indices above 1.3, referred to as high-refractive index materials in this disclosure, including but not limited to transparent silicone or epoxy, which typically have refractive indices between 1.4 and 1.55.

Figure 4B:
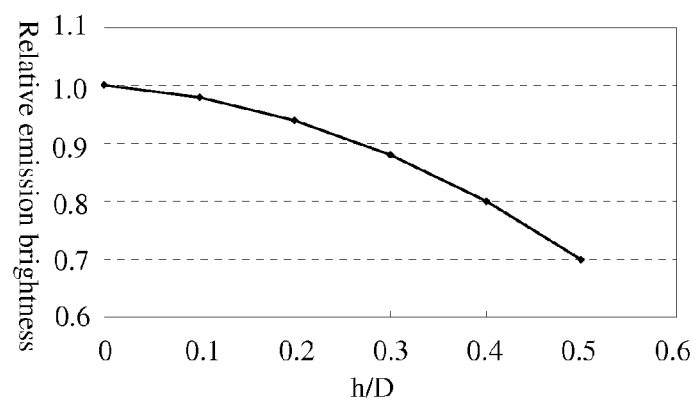
FIG. 4b illustrates a relationship between emission brightness and h/D when the LED of this invention has a high refractive index media covering its surface.

However, as explained earlier, the high-refractive index material covering the light emitting surface will significantly reduce the brightness of the LED units. As shown by experiments, the amount of brightness reduction of the LED unit is related to the thickness h of the high-refractive index material and the size of the LED chip of the LED unit, as shown in FIG. 4b. Here D is the diameter of the bounding circle of the light emitting surface of the LED chip (see FIG. 4a). As shown in FIG. 4b, as the value of h/D increases, the brightness of the LED unit decreases rapidly; when h/D=0.5, the brightness of the LED unit decreases to 70% of its value when the LED unit is not covered by the high-refractive index material (i.e. h/D=0).

Thus, it can be seen that there is a conflict between the brightness of the LED unit and its reliability. When the thickness of the high-refractive index material is less than 50% of the diameter of the bounding circle of the light emitting surface of the LED chip, the brightness of the LED unit is higher than 70% of its value when the LED unit is covered by a low-refractive index material (such as air), which is often acceptable in practice.

The pattern observed in FIG. 4b can be explained by the structure of the LED unit shown in FIG. 4a. Here, the LED chip 401 is mounted on the heat conducting substrate 402, and a high-refractive index medium 403 covers the surface of the LED chip 401. The low angle light 412 emitted by the LED chip 401 can directly penetrate the interface between the high-refractive index medium and the air above it and be output. High angle light 413 is totally reflected at the interface between the high-refractive index medium and the air above it, and falls onto an area outside of the LED chip. Even when the area outside of the LED chip is a reflective surface, so that the light 413 can be reflected and ultimately become output, this part of the light energy is located outside of the output area of the LED chip 401, constituting stray light and cannot be ultimately utilized. For light 411 which is between lights 412 and 413, although this light is totally reflected at the interface between the high-refractive index medium and the air above it, the reflected light returns to the surface of the LED chip 401; it is reflected by that surface again and ultimately becomes output light. This part of the light can be ultimately collected and utilized.

It can be seen that, the high-refractive index medium can cause total reflection of light 411 and 413; but as long as the h/D ratio is relatively small, most of the totally reflected light will return to the LED chip itself, then the proportion of the light 411 is relatively high and the proportion of the stray light caused by light 413 is relatively low. In this situation the brightness loss of the LED unit is not too large.

Of course, as the manufacturing process for LED chips improves and their reliability increases, when the reliability of the light source can be ensured or in applications where requirement on reliability is not high, LED chips that are not covered by any high-refractive index medium can maximize the brightness of the light source.

In this embodiment, the LED array 101 includes two types of LED units 101a and 101b which emit two different color lights; each type of LED unit is uniformly distributed in the LED array 101. In FIG. 1a, the LED units 101a and 101b are shown as being arranged in a staggered manner.

Figure 2:
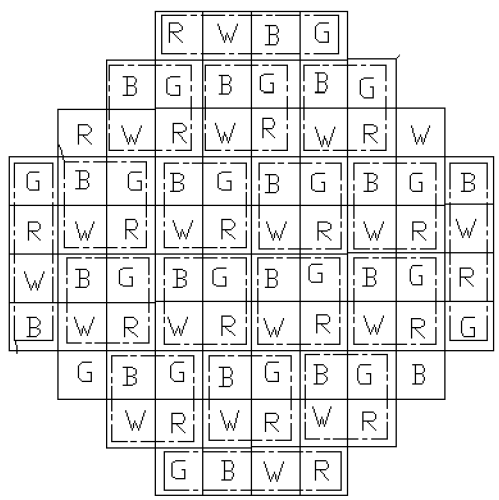
FIG. 2 is a top view of an example of an LED array that includes white, red, green and blue LEDs.

In practice, the LED array 101 can also include more than two types of LED units emitting different color lights. A most common example is an LED array 101 that includes white, red, green and blue LEDs, as shown in a top view in FIG. 2. In FIG. 2, each square unit represents an LED unit, and the letters in the square represents the color of that LED unit, e.g., R represents a red LED unit, G represents a green LED unit, B represents a blue LED unit, and W represents a white LED unit.

In this LED array, the LED units are arranged in a square pattern; correspondingly, in the collimator array, the collimator units are also arranged in a square pattern, in a one-to-one relationship (the collimator units are not shown in FIG. 2). In a more preferred embodiment, to make the LED units in the LED array more compact, the LED units are arranged in a honeycomb pattern; correspondingly, in the collimator array, the collimator units are also arranged in a honeycomb pattern, where the LED units and the collimator units have a one-to-one relationship.

As a preferred embodiment, in the LED array shown in FIG. 2, to more uniformly mix the output light of the light source, each type of LED units is uniformly distributed in the LED array. For example, the red LED units R are approximately uniformly distributed in the entire LED array. More preferably, the distribution of each type of LED units is approximately symmetrical with respect to the center of the LED array. This can give a more uniform angular distribution for each color component of the output light of the light source.

Figures 3A, 3B:
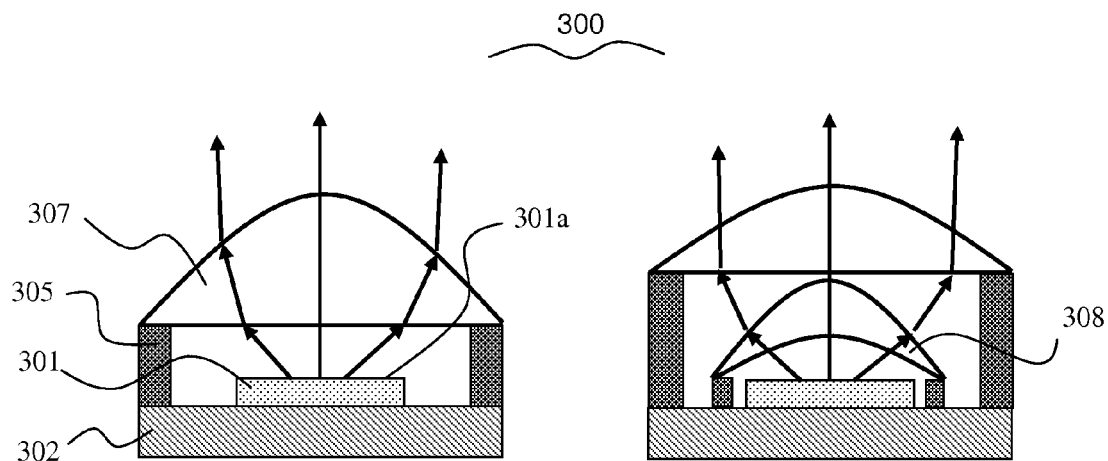
FIGS. 3a and 3b are assembled view of an LED unit and its corresponding collimator unit of the present invention.

In this embodiment, the collimator unit is a convex lens, as shown in FIG. 3a. In this LED unit 300, the LED chip 301 is mounted on a heat conducting substrate 302. A lens support frame 305 is located around the LED chip for mounting the convex lens 307. The light emitting surface 301a of the LED chip 301 is located at the focal plane of the convex lens 307. Based on basic optical principles, it can be seen that the light emitted from the light emitting surface of the LED chip is refracted by the convex lens 307 to become a near parallel output light beam.

In this embodiment, the light collecting capability of a single convex lens is limited. Thus, to increase the light collecting angular range for the LED unit, the collimator unit can be a lens set, a preferred embodiment of which is shown in FIG. 3b. Compared with the collimator unit shown in FIG. 3a, the collimator unit shown in FIG. 3b adds a concave-convex lens above the LED chip. The concave surface faces the LED chip for the purpose of decreasing the incident angle of light from the LED chip onto the concave surface, and also decreasing the reflective loss on the concave surface. By careful optical design of the lens or lens set, the etendue of the light beam can be kept unchanged in the collimating process.

Figures 5A, 5B:
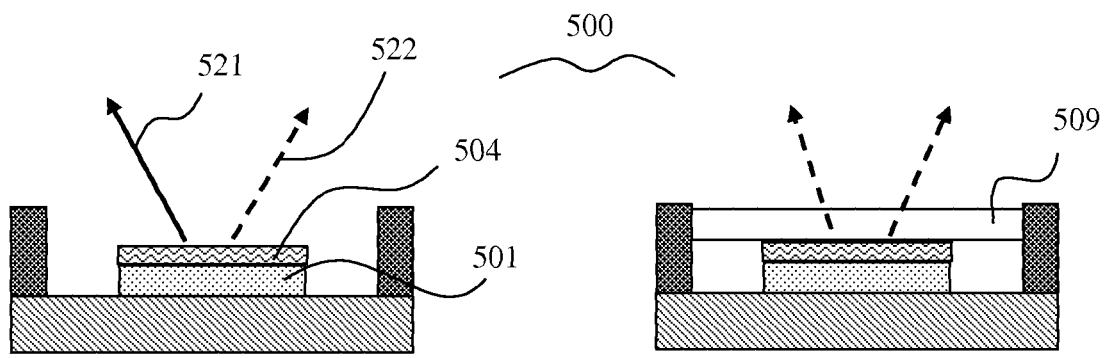
FIG. 5a illustrates an LED of this invention with its surface covered by a high refractive index media mixed with a wavelength conversion material.
FIG. 5b illustrates a filter plate located between the LED unit and the collimator unit in this invention.

In the light source of this embodiment, the LED array such as that shown in FIG. 2 requires LED units that emit white light. This can be achieved by coating a yellow wavelength conversion material on the surface of blue LED chips, as shown in FIG. 5a. Here, the wavelength conversion material layer 504 covers the light emitting surface of the LED chip 501. The wavelength conversion material layer 504 is formed by mixing the wavelength conversion material in the high-refractive index medium having a refractive index greater than 1.3; it absorbs the light emitted by the LED chip 501, and emits a converted light due to light excitation. Similar to the principle of the embodiment shown in FIG. 4a, the thickness of the wavelength conversion material layer 504 should be less than 50% of the diameter of the bounding circle of the light emitting surface of the LED chip 501.

In this embodiment, the LED chip 501 emits a blue light, and the wavelength conversion material in the wavelength conversion material layer 504 is a yellow phosphor. Thus, the output light of the LED unit 500 includes yellow light 522 emitted by the yellow phosphor under excitation, and includes a remaining blue light 521 not absorbed by the wavelength conversion material layer.

It should be noted that generating white light using a blue LED chip and a yellow wavelength conversion material is only an example, and does not limit the use of other wavelength conversion materials.

In practice, to meet certain requirements of special color lights, sometimes a filter plate is needed between the wavelength conversion material and the collimator unit to filter the light outputted by the wavelength conversion material. For example, the filter plate may reflect the excitation light and transmits the converted light, so as to obtain the converted light having a pure color. The reflected excitation light is incident on the wavelength conversion material layer again and is used to excite the wavelength conversion material for the second time. In the LED unit shown in FIG. 5b, the filter plate 509 reflects the excitation light and transmits the converted light. Further, the filter plate can also transmit a portion of the converted light and reflect another portion of the converted light to adjust the color of the output light. This is known technology and will not be described in detail here.

Figure 6:
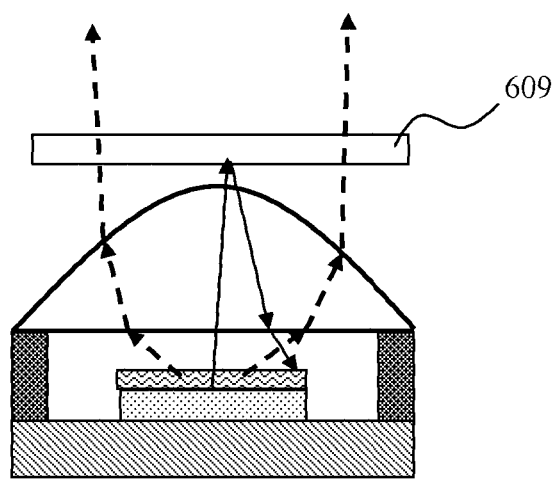
FIG. 6 illustrates a filter plate downstream from collimator unit in this invention.

It should be noted that, as shown in FIG. 6, the filter plate 609 can also be located on the optical path between the collimator unit and the light homogenizing device, which can achieve the function of filtering the light outputted from the collimator unit. Compared with the embodiment of FIG. 5b, the incident angle onto the filter plate 609 of this embodiment is smaller. Thus, the design of the filter plate can be simplified, and it is also easier to manufacture.

Figure 7:
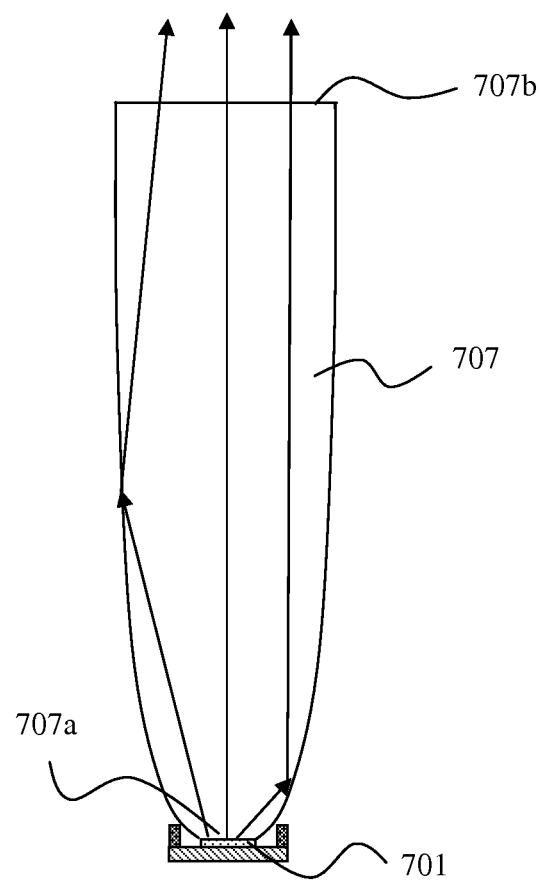
FIG. 7 illustrates a second type of collimator unit according to this invention.

In this embodiment, as shown in FIGS. 3a and 3b, a single convex lens or a lens set is used to collect and collimate the light emitted by the LED unit. In practice, the collimator unit can also be a compound parabolic concentrator (CPC), as shown in FIG. 7. CPC 707 is an optical component designed based on non-imaging principles and can keep the etendue constant. It includes a light input port 707a and a light output port 707b. The light input port 707a is direct next to the light emitting surface of the LED unit 701. The light emitted by the LED unit 701 enters the light input port 707a, and either directly exits the light output port 707b, or is reflected once by the side wall of the CPC 707 and exits the light output port 707b.

The CPC is a light collecting device that preserves the etendue. The area of the light output port is larger than the area of the light input port. Therefore, from equation (3) is can be seen that the light output angle at the output port is smaller than the light output angle at the input port, so as to accomplish collimation of the light.

An advantage of the CPC over a lens or lens set is that, the CPC can collect light of all angles emitted by the LED unit, while the lens or lens set cannot. Therefore, the light collection efficiency of the CPC is higher; but a disadvantage of the CPC is its high cost.

In the embodiments described above, the collimator units and the LED units have a one-to-one correspondence. In practice, one collimator unit can correspond to multiple LED units, as shown in FIGS. 8a and 8b. A difference between FIG. 8a and FIG. 7 is that, the light input port of the CPC 807 corresponds to multiple LED units. In this embodiment, the multiple LED units include four LED units, as shown in the top view of FIG. 8b. In this embodiment, the four LED units are respectively red LED unit 801R, green LED unit 801G, blue LED unit 801B, and white LED unit 801W. These four different colored LED units are arranged in a group; their lights can be mixed by the CPC 807 in the collection and collimation process, which improves the uniformity of the output light of the light source.

It should be pointed out that the example shown here does not limit the use of other combinations of LED units. Similarly, collimators formed of lens or lens set can also be used to correspond to multiple LED units.

Figure 10:
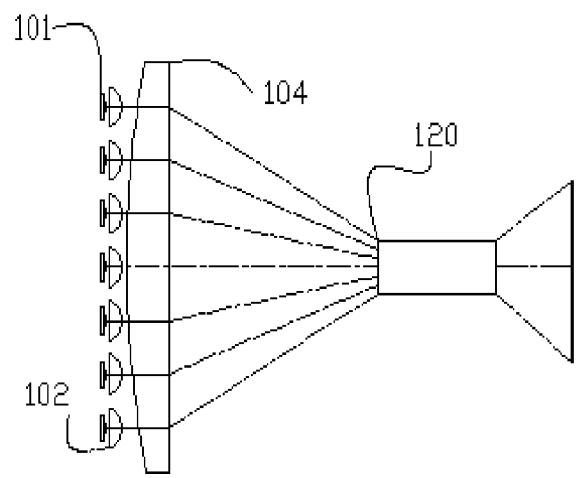
FIG. 10 illustrates the structure of a second embodiment of the present invention.
Figure 11:
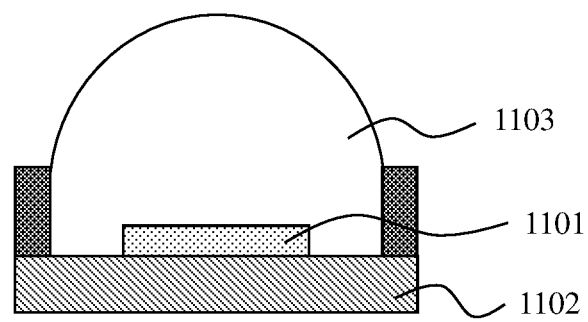
FIG. 11 illustrates the packaging structure of a conventional LED unit.
Figure 12:
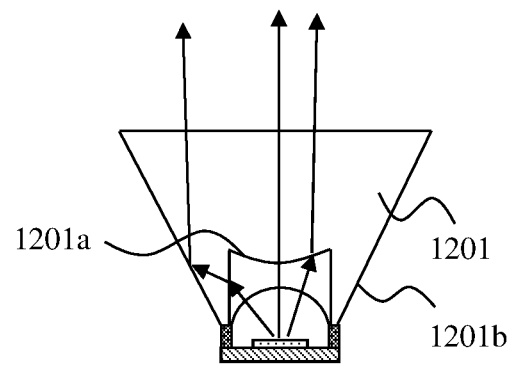
FIG. 12 illustrates the structure of a conventional collimating lens.

In this embodiment, the light homogenizing device is a fly-eye lens pair. In practice, the light homogenizing device can also be a light integrator rod, as in the second embodiment of the present invention shown in FIG. 10.

In this embodiment, the light source further includes a focusing lens 104 located on the optical path between the collimator array 102 and a light integrator rod 120, for focusing the light output from the collimator array 102 onto the input port of the light integrator rod 120. In this embodiment, by the multiple reflections on the inner surface of the integrator rod 120, the different colored lights can be uniformly mixed.

The present invention also provides an illumination device, as shown in FIG. 9. The illumination device includes the above-described light source. Specifically, the illumination device includes a light 100 similar to the one shown in FIG. 1; the light from the light source 100 passes through a set of lenses 104 and 109 to be projected on the screen 105, forming a uniform light spot.

This embodiment further includes a control device 200, for respectively and independently controlling the on and off as well as input power of the LED units of each color in the light source 100. This can control the intensity and color of the mixed output light of the illumination device.

In the light source and illumination device of this invention, by controlling the medium that covers the LED chip surface and the thickness of the medium, the etendue of the light emitted by the LED chip can be minimized; meanwhile, by controlling the design of the collimator array unit, the etendue of the light emitted by the LED unit is not increased when passing through the collimator array unit; and finally, by using the light homogenizing device, the light emitted by LED units of two or more different colors are uniformly mixed, to ultimately achieve a output light spot having a uniform color and a maximum brightness.

The above described embodiments of the present invention are exemplary only and do not limit the scope of the invention. Any equivalent structures and equivalent processes and variations based on the instant disclosure and drawings, or direct or indirect applications in other relevant technology areas, are all within the scope of patent protection of this invention.

What is claimed is:

1. A light source, comprising:
   a light emitting diode (LED) array, the LED array including at least two types of LED units emitting different color lights, each LED unit including an LED chip;
   wherein a light emitting surface of each LED chip is covered by a low-refractive index transparent medium having a refractive index lower than 1.1;
   a collimator array, including at least one collimator unit, wherein each collimator unit corresponds to at least one LED unit, for collimating a light emitted from the at least one LED unit while maintaining an etendue of the light from the at least one LED unit substantially unchanged;
   a lens support structure including a lens support frame located around each LED chip, wherein the collimator unit corresponding to each LED unit is mounted on the lens support frame with the low-refractive index transparent medium located between the collimator unit and the light emitting surface of the LED chip; and
   a light homogenizing device for smoothing a light from the collimator array.

2. The light source of claim 1, wherein the low-refractive index medium is air.

3. The light source of claim 1, wherein each type of LED units emitting one color light are uniformly distributed in the LED array.

4. The light source of claim 3, wherein a distribution of each type of LED units emitting one color light is approximately symmetrical with respect to a center of the LED array.

5. A light source, comprising:
   a light emitting diode (LED) array, the LED array including at least two types of LED units emitting different color lights, each LED unit including an LED chip;
   wherein a light emitting surface of each LED chip is covered by a high-refractive index transparent medium having a refractive index greater than 1.3, the high-refractive index transparent medium having a wavelength conversion material mixed therein, wherein the high-refractive index medium has a thickness less than 50% of a diameter of a bounding circle of the light emitting surface of the LED chip;
   a collimator array, including at least one collimator unit, wherein each collimator unit corresponds to at least one LED unit, for collimating a light emitted from the at least one LED unit while maintaining an etendue of the light from the at least one LED unit substantially unchanged; and
   a light homogenizing device for smoothing a light from the collimator array.

6. The light source of claim 1, further comprising a filter plate located on an optical path between the LED units and the collimator units, for filtering the light emitted by the LED units.

7. The light source of claim 1, further comprising a filter plate located on an optical path between the collimator unit and the light homogenizing device, for filtering a light from the collimator unit.

8. The light source of claim 1,
   wherein in the LED array, the LED units are arranged in a square pattern; and
   wherein in the collimator array, the collimator units are arranged in a square pattern.

9. The light source of claim 1,
   wherein in the LED array, the LED units are arranged in a honeycomb pattern; and
   wherein in the collimator array, the collimator units are arranged in a honeycomb pattern.

10. The light source of claim 1,
    wherein the light homogenizing device is a fly-eye lens pair, including a first fly-eye lens and a second fly-eye lens;
    wherein the first fly-eye lens includes periodically arranged first fly-eye lens units;
    wherein the second fly-eye lens includes periodically arranged second fly-eye lens units; and
    where the first fly-eye lens units and the second fly-eye lens units have a one-to-one correspondence with each other.

11. The light source of claim 10, wherein the first fly-eye lens units are arranged in a honeycomb pattern; and wherein the second fly-eye lens units are arranged in a honeycomb pattern.

12. The light source of claim 1,
    wherein the homogenizing device is an integral fly-eye lens, including a first surface and a second surface;
    wherein the first surface includes periodically arranged third fly-eye lens units;
    wherein the second surface includes periodically arranged fourth fly-eye lens units; and
    where the third fly-eye lens units and the fourth fly-eye lens units have a one-to-one correspondence with each other.

13. The light source of claim 12, wherein the third fly-eye lens units are arranged in a honeycomb pattern; and wherein the fourth fly-eye lens units are arranged in a honeycomb pattern.

14. The light source of claim 1, further comprising:
    a focusing lens located on an optical path between the collimator array and the light homogenizing device, for focusing the light from the collimator array onto the light homogenizing device; and
    wherein the light homogenizing device is a light integrator rod.

15. The light source of claim 1, wherein the light homogenizing device is a diffractive optical element.

16. An illumination device which includes the light source of claim 1.

17. The illumination device of claim 16, further comprising a control device, for respectively and independently controlling on and off and input powers of each type of LED units emitting one color light.

18. The light source of claim 5, further comprising a filter plate located on an optical path between the LED units and the collimator units, for filtering the light emitted by the LED units.

19. The light source of claim 5, further comprising a filter plate located on an optical path between the collimator unit and the light homogenizing device, for filtering a light from the collimator unit.

20. An illumination device comprising:
- a light emitting diode (LED) array, the LED array including at least two types of LED units emitting two different color lights, each LED unit including an LED chip;
- wherein a light emitting surface of each LED chip is covered by a low-refractive index transparent medium having a refractive index lower than 1.1;
- a collimator array, including at least one collimator unit, wherein each collimator unit corresponds to at least one LED unit, for collimating a light emitted from the at least one LED unit while maintaining an etendue of the light from the at least one LED unit substantially unchanged;
- a lens support structure including a lens support frame located around each LED chip, wherein the collimator unit corresponding to each LED unit is mounted on the lens support frame with the low-refractive index transparent medium located between the collimator unit and the light emitting surface of the LED chip;
- a light homogenizing device for smoothing a light from the collimator array; and
- a control device, for respectively and independently controlling on and off and input powers of each type of LED units emitting one color light.

* * * * *